United States Patent
Jamieson et al.

(10) Patent No.: US 7,133,029 B2
(45) Date of Patent: Nov. 7, 2006

(54) KEYPAD

(75) Inventors: Andrew R Jamieson, Mulgrave (AU); David J McGregor, Mulgrave (AU)

(73) Assignee: MCOM Solutions Inc., Wilmington, DE (US)

( * ) Notice: Subject to any disclaimer, the term of this patent is extended or adjusted under 35 U.S.C. 154(b) by 356 days.

(21) Appl. No.: 10/470,985

(22) PCT Filed: Mar. 16, 2001

(86) PCT No.: PCT/AU01/00301

§ 371 (c)(1),
(2), (4) Date: Jul. 31, 2003

(87) PCT Pub. No.: WO01/77801

PCT Pub. Date: Oct. 18, 2001

(65) Prior Publication Data

US 2004/0090421 A1   May 13, 2004

(30) Foreign Application Priority Data

Apr. 6, 2000   (AU) .................................... PQ 6734

(51) Int. Cl.
*G09G 5/00* (2006.01)
*H04K 1/00* (2006.01)
*H04L 9/00* (2006.01)

(52) U.S. Cl. ....................... 345/168; 345/170; 713/184

(58) Field of Classification Search .................. 341/26; 345/170, 168; 713/184; 380/52

See application file for complete search history.

(56) References Cited

U.S. PATENT DOCUMENTS

| | | | |
|---|---|---|---|
| 4,926,173 A | 5/1990 | Frielink | |
| 5,254,989 A | 10/1993 | Verrier et al. | |
| 5,914,677 A * | 6/1999 | Ahmadian | 341/26 |
| 6,040,788 A * | 3/2000 | Chambers et al. | 341/26 |
| 6,054,940 A | 4/2000 | Greene | |
| 6,424,274 B1 * | 7/2002 | Schnizlein et al. | 341/26 |
| 6,426,710 B1 * | 7/2002 | Chang et al. | 341/26 |

FOREIGN PATENT DOCUMENTS

GB   2 223 115   3/1990

* cited by examiner

*Primary Examiner*—Kent Chang
*Assistant Examiner*—Donna Lui
(74) *Attorney, Agent, or Firm*—Michael Best & Friedrich LLP

(57) ABSTRACT

A keypad is disclosed which has a plurality of keys (12) for the input of information. Each key has a first switch (80) and a second switch (90). The first switches (80) are all connected to a common electrical interconnection (120) and the second switches (90) are connected into a matrix electrical interconnection (62, 100). The microprocessor (66) detects a global signal on the common interconnection (120) and supplies scan signals to the matrix interconnection (62, 100) to enable detection of a particular key. The processor (66) may also selectively change the state of lines (62, 100) of the matrix and also maintain particular lines in a predetermined state by open drain ports of the processor to which the lines of the matrix are connected.

16 Claims, 10 Drawing Sheets

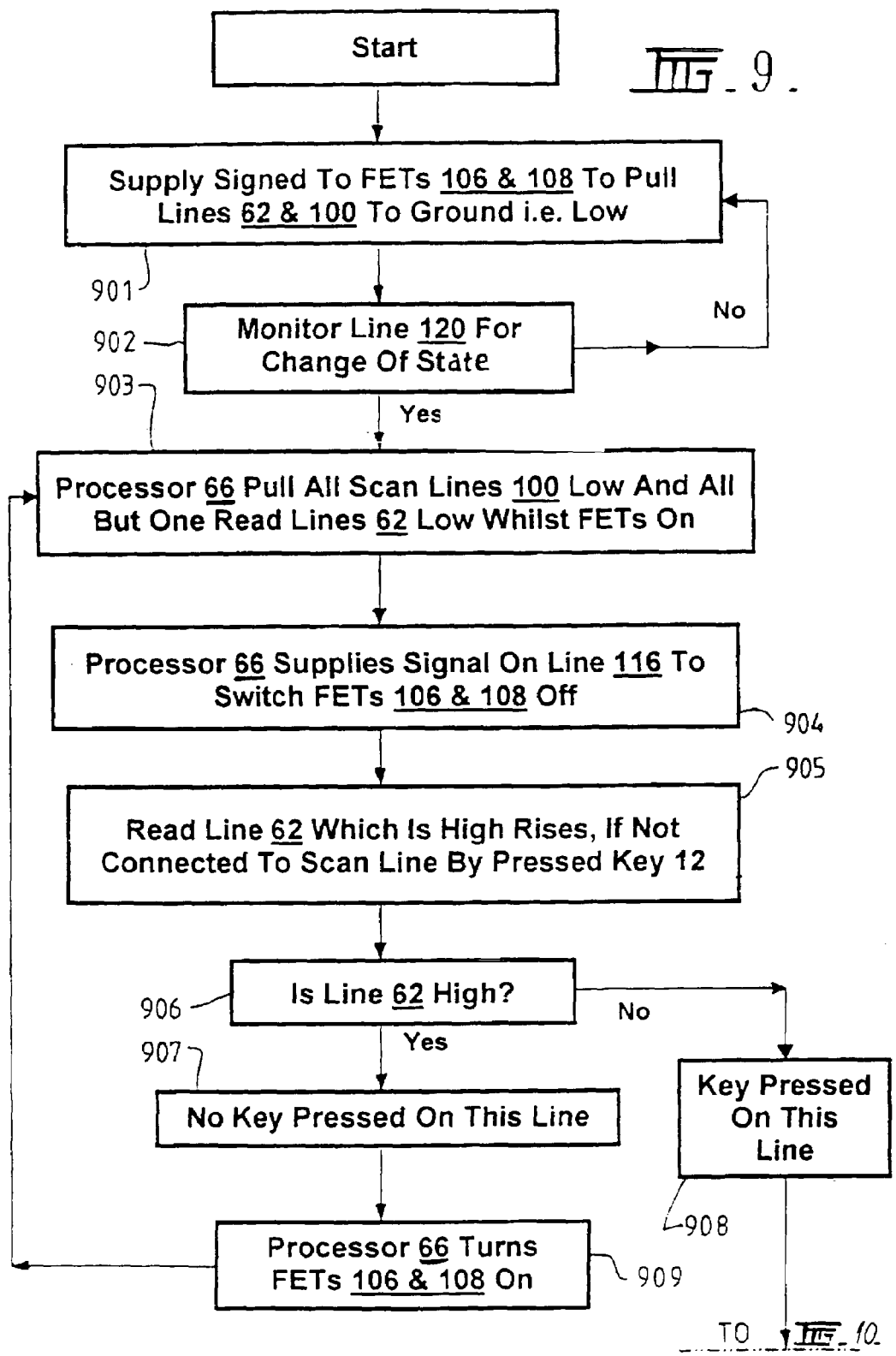

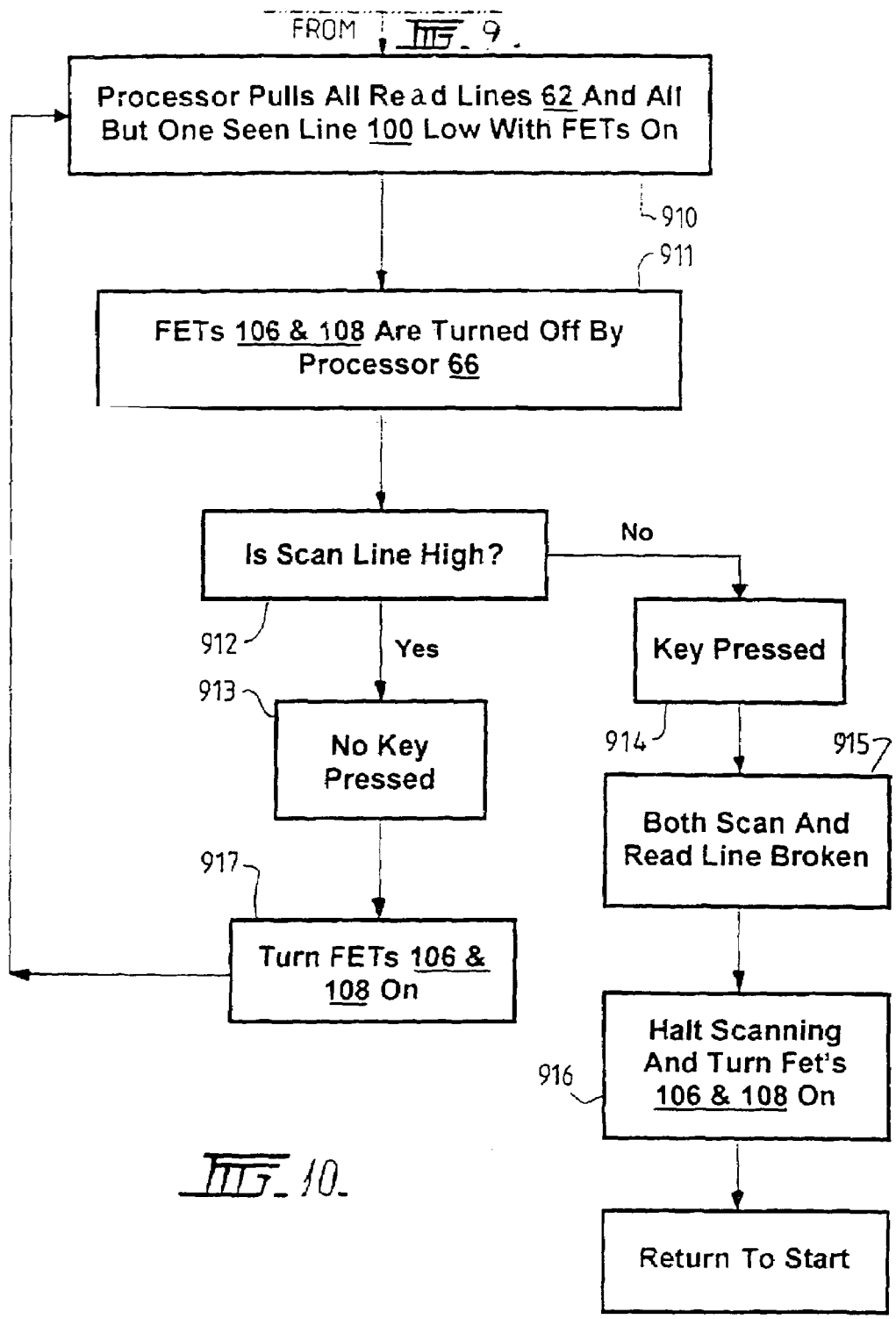

KEYPAD

This application is a 371 of PCT/AU01/00301 Mar. 16, 2001.

FIELD OF THE INVENTION

This invention relates to a keypad and in particular to a keypad for input of data such as financial data to enable financial transactions such as eftpos transactions to take place. However, it should be understood that the keypad is not limited to such applications and could be used in other environments where secure input of data into a system is required.

DESCRIPTION OF THE PRIOR ART

Keypads are used on almost all electronic devices which require some form of input. Often these keypads take the form of an electronic matrix of wires, the keys themselves bridging the horizontal and vertical lines of this matrix, and thus forming an electrical connection between a specific horizontal and a specific vertical wire when pressed. The device controlling the keypad (usually some form of computer, or CPU) can then ascertain the exact key pressed by determining which of the wires of the matrix are connected. A suitable analogy might be to imagine the use of a grid on a map to determine the exact location of a street.

The determination of keypresses via such a matrix of wires requires the active, and constant, "scanning" of the lines in the keypad. This is achieved by presenting a voltage signal on only one of the matrix lines, and testing the corresponding matrix lines to see if that voltage signal has appeared there as well. For example, if we assume a keypad that has a 4×4 matrix, to determine if any key has been pressed, a voltage signal (called a "logic high") is presented on the first of the vertical lines of the matrix. All of the other vertical lines are left inactive (no voltage signal present, or a "logic low"). The voltage inputs at the horizontal lines of the matrix are now tested ("read"). If any of the keys that exist on the Read line are currently pressed, the n the logic high presented on this line will be passed to the corresponding horizontal line, via the switch. Thus the state of all of the switches on the first vertical line has been determined by the "scanning" of this line with a logic high signal, and a corresponding read of the voltage levels of all of the horizontal lines. Any matching voltages indicate a key press (i.e. a short circuit between the horizontal and vertical lines that has been created via a keypress). This process is then continued with all of the subsequent vertical "scan" lines and reading back the state of the horizontal "read" lines after the setting of each single logic high. Once all of the scan lines have been checked, the whole process is repeated.

Thus it can be seen that the scanning of the keypad is both an active and continuous endeavour. An occasional alternative to this is that during periods of inactivity, all of the scan lines are set to a logic high, and a transition of any of the read lines to a high state is set to "wake-up" the computer/CPU to start scanning the keypad to determine the exact key pressed. This allows for a cessation of the scanning during periods of extended inactivity, and thus allows the device to reduce any processing overhead/power consumption caused by the continual scanning. Also it would be obvious to anyone skilled in the art that the state of the voltage signals may be swapped (scan with only one line low, instead of high), or altered in some other trivial way to better suit an individual situation.

This method of key press determination is preferably acceptable for most applications. However, for applications that have a requirement of security, it is often desirable to attempt different key scan regimes to prevent the determination of keypresses by an external party. The method by which an external party may ascertain the state of the keypad is simple: Given unrestricted access to the keypads, an external party may attach "probes" across each of the key-mats (matrix junctions, the points at which the keys form short circuits), and thus determine any key press by acting as a passive observer to the scanning of the computer/CUP to which the keypad is attached. If an observer knows that a logic high on both a scan and a read line indicate that key is pressed at the junction of these lines, it is a simple matter to observe the state of all of the scan and all of the read lines, and thereby determine the state of all of the keys of the keypad.

Many attempts have been made to prevent an external party from successfully performing such an observation of the keypad scanning signals. These attempts may be grouped under the heading of "scan obfuscation", i.e. the technology used to confuse the scan line signals. The most common keypad obfuscation technique is to present "dummy" keypresses on the key matrix. "Dummy" keypresses are, in fact, false keypresses that are created by the controlling CPU to confuse any attempt to determine a real key depression. This may be achieved by a number of methods, such as using electronically controlled switches such as field effect transistors, or relays, to present a short circuit across the switch; or simply presenting the same voltage at both the read and the scan line. The general idea remains the same; before each keypad scan, a number of keys are selected to be "dummy" pressed for that scan, and the relevant circuitry activated to achieve this. Then, during the instant of the scan, these lines appear as valid keypresses (IE the voltage on the read line is the same as the scan line, simulating a short circuit caused by the pressing of the switch), and cannot be externally differentiated from any real keypresses that are detected during that scan period. Only the CPU "knows" which keypresses were dummies, and therefore which (if any) were the real keypresses. There is a major problem with this regime, however; as the voltage levels on either side of a dummy key press are the same, a real key press cannot be detected on any key that is dummy pressed. This is not so much of a problem provided that the dummy keypresses are moved around the keypad with no dummy press having duration on any key that is of comparable duration to a real keypress. If the dummy presses are moved around in such a manor, even if a dummy press exists on a key that has a real key press active on it, the dummy press will be moved from that key before the key is un-pressed, and thus the real key press will be detected. However, this presents an outside observer with a means to differentiate the dummy presses from the real presses; any key press that lasts for more than a certain duration must be real otherwise it would not be possible to scan that key. To put it another way, although a dummy press may be convincing during the instant of the scan, its ability to confuse real key presses is reduced when a large number of scans is observed. If a dummy key press lasts for only 10 ms, it will not hamper the detection of a real key press that lasts for >100 ms.

As it is not possible to "un-short circuit" a short circuit by a real key press (disregarding any mechanical means that may be used to physically un-press the switch), the use of dummy keypresses has been seriously hampered by this intrinsic problem of duration. This problem could be mitigated if it was possible to stop scanning once a real key press was detected, and only resume scanning once the key was un-pressed. The observer would then have to choose between the last dummy pressed keys, and the real key, and could not use the duration of the real key press to assist the choice, as no more key presses (real or dummy) would be visible until the real key was released, and scanning resumed. However, it is clear that the release of the key cannot be detected unless the scanning continues.

SUMMARY OF THE INVENTION

The present invention provides a keypad including;
a plurality of keys for actuation by a user to input data into the keypad;
a matrix electrical interconnection interconnecting the keys so that actuation of a key can be detected by scan signals applied to the matrix and by reading signals from the matrix electrical interconnection; and
control means for causing the matrix electrical interconnection to change state independently of the depression of a key to thereby disguise which of the keys has been pressed, and to interrogate the matrix electrical interconnection having regard to the caused change of state of the keys to determine which of the keys has actually been pressed.

Thus, according to the invention in its broadest aspect, because the control means causes the matrix to change state independent of the key which has been depressed, it is not possible for anyone attempting to monitor the matrix to determine a change in state which will identify a depressed key to obtain information which will enable the key to be depressed because of the change of state of the matrix independent of the key which has been depressed. Thus, information is obtained by anybody attempting to break into the keypad is not indicative of the keys which has been depressed and therefore it does not provide information which enable security codes or other sensitive information which is keyed into the keypad to be obtained.

Preferably the matrix electrical interconnection includes a plurality of read lines and a plurality of scan lines, the scan lines and read lines being interconnected by the keys so that when a key is depressed a scan line is connected to a read line.

In on embodiment of the invention the control means is for outputting dummy signals on the read lines so that the read lines are caused to change state in random fashion so that a change in state of a read upon depression of a key is one change in state amongst many changes of state of the read lines and, wherein, since the control means knows which of the read lines has been caused to change state by dummy signals the control means can determine which of the lines has changed state not due do to a dummy signal and therefore which of read lines is associated with a pressed key.

In as still further embodiment of the invention the scan lines are connected to open drain ports of the control means so that when the scan lines are connected to a read line by the depression of a switch the read line will maintain a predetermined state notwithstanding the control means attempting to change the state of that read line, and wherein the control means applies signals to the read lines to make the read lines change state and identifies a read line associated with a depressed key by the read line not changing state when an attempt is made to make the read line change state because of the connection of that read line to the open drain port via the depressed key.

According to a first aspect of this embodiment of the invention all of the keys are connected to a single scan line.

In accordance with a second aspect of this embodiment the keys are associated with a plurality of different scan lines and the scan lines are interconnected by electrical interconnection means so that when the electrical interconnection means is switched to a first state all of the scan lines are connected together so that depression of a key will cause one of the read lines to change state thereby indicating that a key has been pressed and whereupon the electrical interconnection means has its state changed by the control means so that the scan lines are disconnected one from the other so that scan signals can be applied to the scan lines to enable the scan line associated with the pressed key to be identified and wherein the controller attempts to change the state of the read lines so that the read lines change state if they are associated with keys which have not been pressed and if the read line is associated with a key which has been pressed the read line does not change state because of connection to an open drain port of the controller via the pressed key to thereby enable the controller to identify the read line which is associated with the pressed key.

Preferably the matrix electrical interconnection provides a global signal upon depression of any of the keys which is detected by the controller so that the controller knows that a key has been pressed and the controller then initiates a scanning regime to determine which of the keys has been pressed.

In one embodiment the global signal can be provided by a second switch associated with each key which is closed upon depression of the key to cause the global signal to be provided to the controller.

In a still further embodiment the global signal is provided by a change in state of at least one of the scan lines.

Preferably a plurality of scan lines are connected together by electrical connection means in order to identify depression and release of a key and the electrical connection means disconnects the scan lines one from another so that a scanning regime can be initiated to determine which of the scan lines is associated with a pressed key.

Preferably switching means is provided for maintaining the matrix electrical interconnection at a predetermined state and for switching the matrix electrical interconnection so that the interconnection is able to take up a state dependent on the signals supplied by the control means and the pressing of a key so that scanning signals can then be supplied to interrogate the matrix. This embodiment of the invention ensures that all of the signals generated by the control means are seen at exactly the same time when the switching means switches so that the switching means no longer holds the state of the interconnection at that predetermined state, thereby preventing an attacker from obtaining information relating to which key has been depressed by timing differences between when signals actually appear on the matrix.

Preferably the switching means comprises at least one field effect transistor which is switched to a predetermined state to cause the matrix to maintain a predetermined state and which, when switched to another state enables the matrix to take up a state dependent on the signals supplied by the control means and the pressing of a key.

Another aspect of the present invention provides a keypad including;
a plurality of keys for actuation by a user to input data into the keypad;
a first switch and a second switch associated with each key, both of which switches undergo a change of state between an open and a closed condition when a respective key is actuated by the user;

a common first electrical interconnection, interconnecting all of the first switches of the plurality of keys so that when any key is actuated a global signal is supplied to the common first electrical interconnection;

a matrix electrical interconnection interconnecting the second switches of the plurality of keys so that actuation of a key can be detected by scan signals applied to the matrix for electrical interconnection and by reading signals from the matrix electrical interconnection; and a controller for detecting the global signal on the common first electrical interconnection and for supplying scan signals to the matrix electrical interconnection and reading signals from the matrix electrical interconnection to detect which key of the plurality of keys has been depressed.

Since the first switch is connected identically for all of the keys (i.e. all of the first switches are connected in parallel), the only information that can be determined by activity on the first switches is that one of the many keys of the keypad has been depressed. As this first switch is connected to exactly the same circuit for each and every key, it is not possible to determine the specific key pressed and any electrical information present on one of the switches is simultaneously present on all of the other switches. Thus, through the agency of the first switch, it is possible to cease the scanning of the keypad once a valid key has been detected, and only resume the scanning once the key has been lifted. In fact, it is possible to only begin scanning once a key has been detected (through activity on the first switch), and cease once the identity of the key pressed has be determined. Dummy presses of keys can therefore be generated by the controller during the scanning cycle, or virtual presses appear to take place, so that the duration of the dummy press and the real press are substantially the same thereby not providing any means by which an attacker can distinguish between a dummy press and a real press of a key and thereby obtain indication of the actual keys depressed during the entry of data into the keypad.

Preferably the matrix electrical interconnection comprises a plurality of row lines connected to plural sets of the second switches and a plurality of column lines connected to second plural sets of the second switches, each of the second plural sets including one switch from the plural first set of second switches so that each second switch connects one of the row lines to one of the column lines.

Preferably the controller outputs scanning signals to the column lines and reads signals from the row lines so that when one of the keys is actuated and the respective second switch changes state the controller can determine which key has been actuated from a scan signal applied to one of the scan lines and the reading of a signal on the corresponding row line.

Preferably the common first electrical interconnection comprises a single line coupled to the controller and a plurality of parallel lines each connected to the single line and connected to each of the first switches.

Preferably each of the second switches has a means for forcing the matrix electrical interconnection to go to a predetermined state between scans. This preferred aspect of the invention pulls the matrix to one particular state to prevent an attacker from implementing a predetermined scan regime. That is, if an attacker attempts to break into the keypad and invoke its own scan regime onto the matrix to detect the depression of keys, the forcing of the matrix to a predetermined state will prevent the scan regime from taking place thereby preventing the attacker from detecting the depression of keys.

Preferably the means for forcing the matrix to a predetermined state comprises field effect transistors.

Preferably the field effect transistors are driven by inverters and pull the column lines and row lines to a low state between scans of the column lines under the control of the controller.

Preferably the inverters are each coupled to a main inverter which is coupled to the controller so that when the controller outputs a high signal the main inverter supplies a low signal to the plurality of inverters which in turn supplies a high signal to the field effect transistors to pull the field effect transistors low to thereby pull the matrix low.

Preferably the controller is a microprocessor.

Preferably each of the keys comprises a block member mounting a pair of contact members, each first and second switch being formed by a said contact member which comprises one component of each switch and another switch component arranged below the respective contact member, the block member being resiliently mounted so that upon actuation of the key the block member is moved from a first position, where the contact members are separated from the said another switch components so that the first and second switches are open, to a second position where the contact members bridge the said another switch components to close the first and second switches.

Preferably the block is connected to a base member by a resilient connection so that when the key is released at the second position, the key moves from the second position to the first position under the influence of the resiliency of the resilient member.

Preferably the resilient member is integral with the block.

Preferably the contact members comprise carbon tabs embedded in the blocks and project outwardly of the blocks.

Preferably the said another component of the first and second switches comprise a plurality of first fingers and a plurality of inter-meshed but spaced second fingers so that when the key moves from the first position to the second position the contact members bridge the first and second fingers to close the switches so that a row line connected to the first fingers is connected to a column line connected to the second fingers.

A further aspect of the invention may be said to reside in a keypad including;

a plurality of keys for actuation by a user to input data into the keypad;

a switch associated with each key, which switch undergoes a change of state between an open and a closed condition when a respective key is actuated by the user;

a matrix interconnection, interconnecting the switches, the matrix having pairs of lines interconnectable by the switches;

state maintaining means for maintaining a predetermined state of lines; and a controller for selectively changing the state of lines of the matrix and reading lines of the matrix to determine whether a key has been actuated, and wherein lines are maintained in a predetermined state by the state maintaining means notwithstanding the controller attempting to change the state of those lines and the depression of the key.

Since this aspect of the invention includes a state maintaining means, even if the controller attempts to change the state of a line, such as by making the line go high, the actuation of a key will not cause the controller to read a high signal because the line will be maintained low by the state maintaining means thereby not providing information to an attacker of the change of state of the line associated with the actuated key. Since the processor knows which line it has attempted to make high, if the line is read high then a key associated with that line has not been depressed. However, if an attempt is made to make the line go high and the line is read low the controller knows that the key associated with that line has been actuated. Since all of the other lines can be maintained low there is no perceivable difference to an outside observer between the line associated with the key which has been actuated and lines associated with keys which have not been actuated.

Preferably the state maintaining means comprises an open drain circuit.

Preferably the open drain circuit is within the controller and provided by open drain ports of the controller to which the lines of the matrix are connected.

Preferably the matrix interconnection comprises a plurality of read lines and at least one scan line, the controller being for changing the state of the read lines and for reading back the state of the read lines to determine if the read lines have changed state to thereby indicate that a key associated with that read line has not been pressed if the read line does change state and wherein if a key is depressed the read line is connected to a scan line via the depressed key so that the state maintaining means causes that read line to maintain its state notwithstanding the controller attempting to change the state of the line to thereby indicate that a key associated with that read line has been pressed.

In one embodiment of the invention the matrix includes a plurality of scan lines and electrical connection means for selectively connecting the scan lines together or electrically isolating the scan lines one from the other(s).

BRIEF DESCRIPTION OF THE DRAWINGS

Preferred embodiments of the invention will be described, by way of example, with reference to the accompanying drawings in which;

FIGS. 9 and 10 are a flow chart;

DESCRIPTION OF THE PREFERRED EMBODIMENTS

Figure 1:
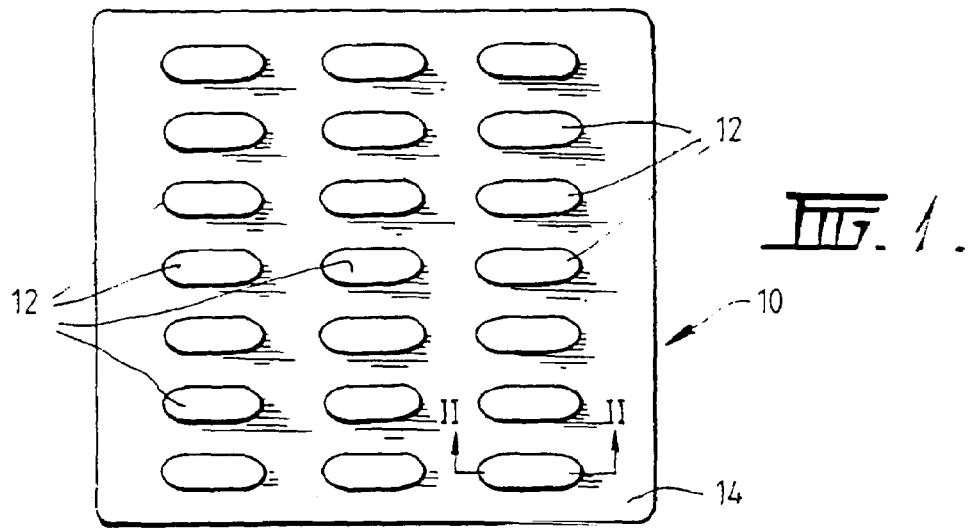
FIG. 1 is a plan view of a keypad embodying the invention.

With reference to FIG. 1 a keypad 10 is shown schematically which includes a plurality of keys 12 which can carry specific indicia such as digits, function statements such as credit transaction, or cheque or savings transaction for an eftpos transaction, as well as enter and other commands. In the embodiment shown some twenty-one keys 12 are included in the keypad but the number of keypads may be more or less depending on the use of the keypad.

Figure 2:
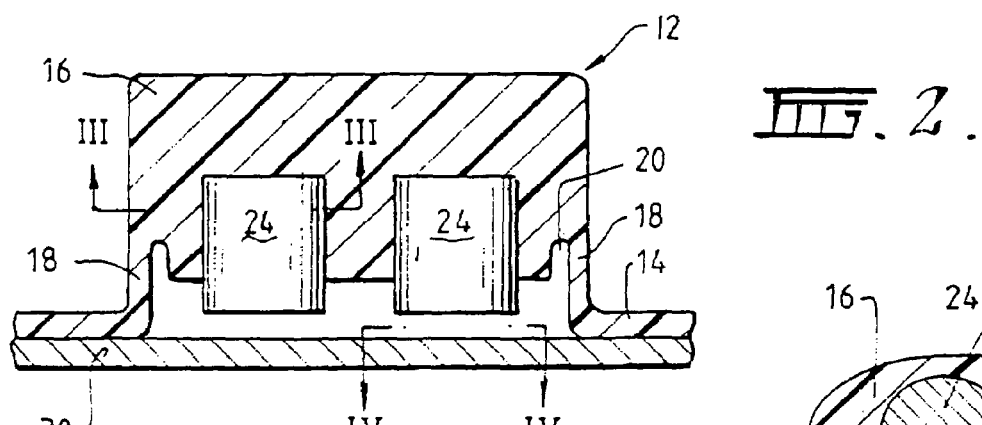
FIG. 2 is a view along the line II—II of FIG. 1.
Figure 3:
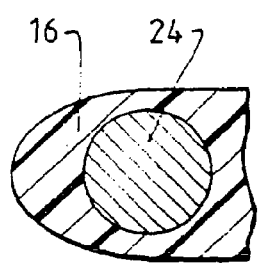
FIG. 3 is a view along the line III—III of FIG. 2.
Figure 4:
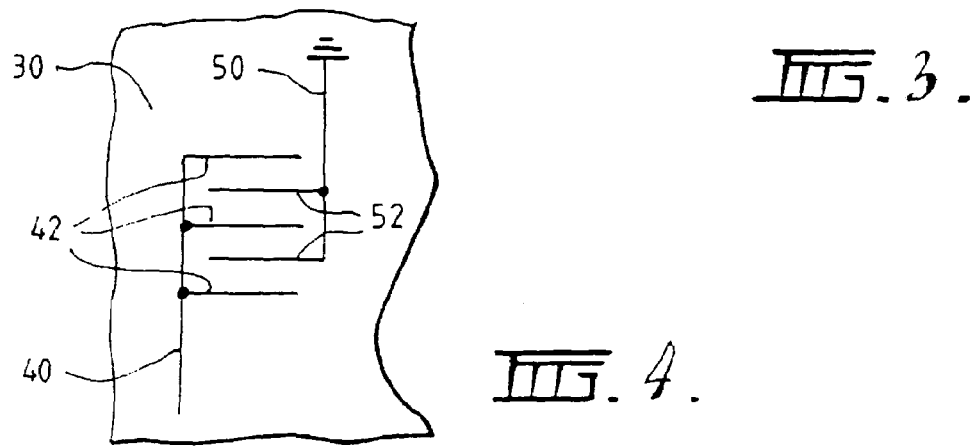
FIG. 4 is a view along the line IV—IV of FIG. 2.
Figure 6:
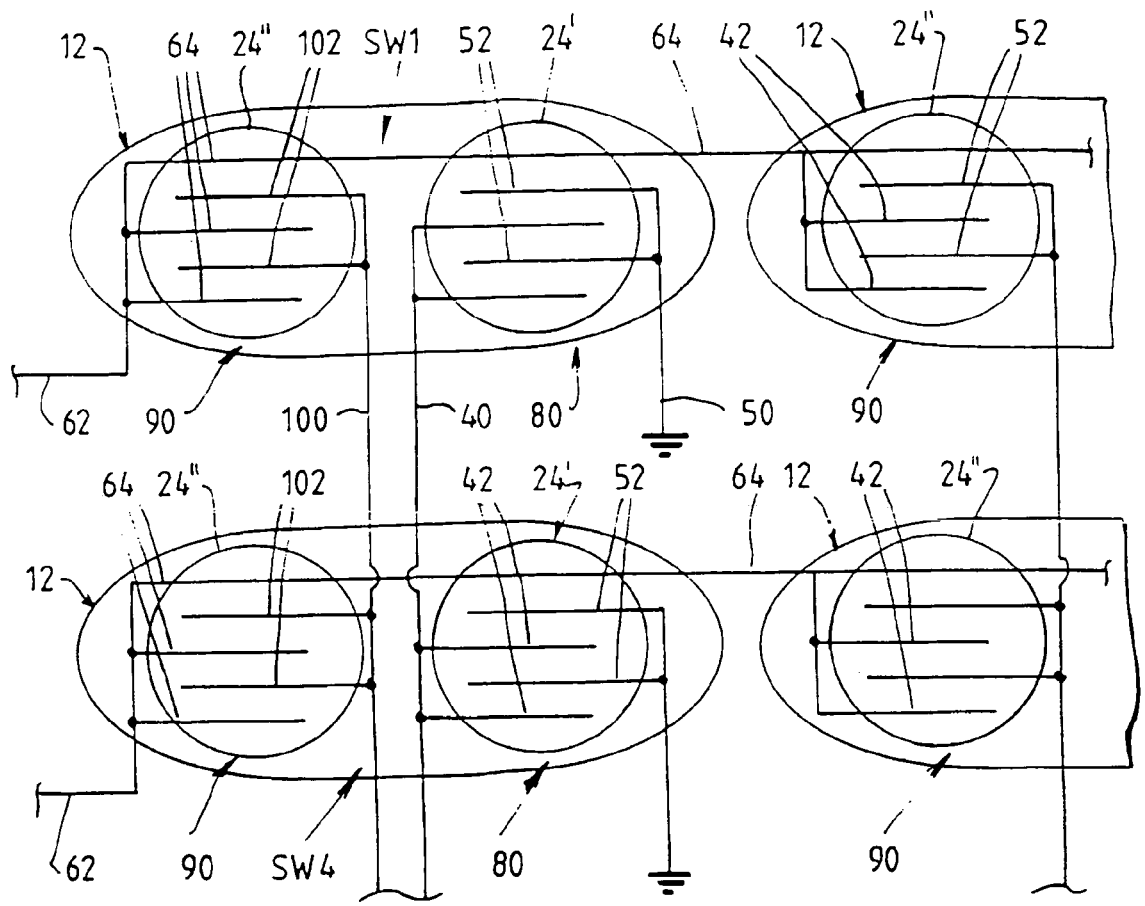
FIG. 6 is a view showing the embodiment of FIG. 1.

As shown in FIG. 2 the keys 12 are formed on a mat 14 and are integral with the mat 14. The mat 14 and keys 12 may be formed from silicone material or the like. Each key 12 includes a block 16 which is connected to the mat 14 by a resilient connection 18 which extends about the periphery of the block 16 where the block 16 merges with the mat 14. An annular recess 20 is provided inwardly of the periphery of the block 16. The block 16 has embedded in it two contact tabs 24 which are formed from electrically conductive material such as carbon or the like. The mat 14 is connected to a circuit board 30 which carries the electrical componentary for operating the keypad 10. The contacts 24 form the first component of first and second switches 80 and 90 associated with each of the keys 12. The second component of the first and second switches 80 and 90 of each key 12 is shown in FIG. 4 and FIG. 6 and generally comprises a plurality of fingers 42 (connected to line 40 in FIG. 4) a plurality of fingers 52 (connected to line 50 in FIG. 4) which mesh with but are spaced from the fingers 42 in respect of switch 80 and similar fingers 64 and 102 (shown in FIG. 6) which are connected to lines 62 and 100, in respect of the switch 90. When the key 12 is depressed the contacts 24 move downwardly so they contact the circuit board 30 and bridge the fingers 42 and 52 and the fingers 64 and 102 thereby causing electrical interconnection between the lines 40 and 50 and 62 and 100 so as to close the switches 80 and 90 in that key 12. When the key 12 is released, the block 16 moves under the resiliency of the resilient connection 18 back to the position shown in FIG. 2 where the contacts 24 are moved away from the circuit board 30 so the switches 80 and 90 are open because the electrical contact between the fingers 42 and 52 (and 64 and 102) are broken.

Figure 5:
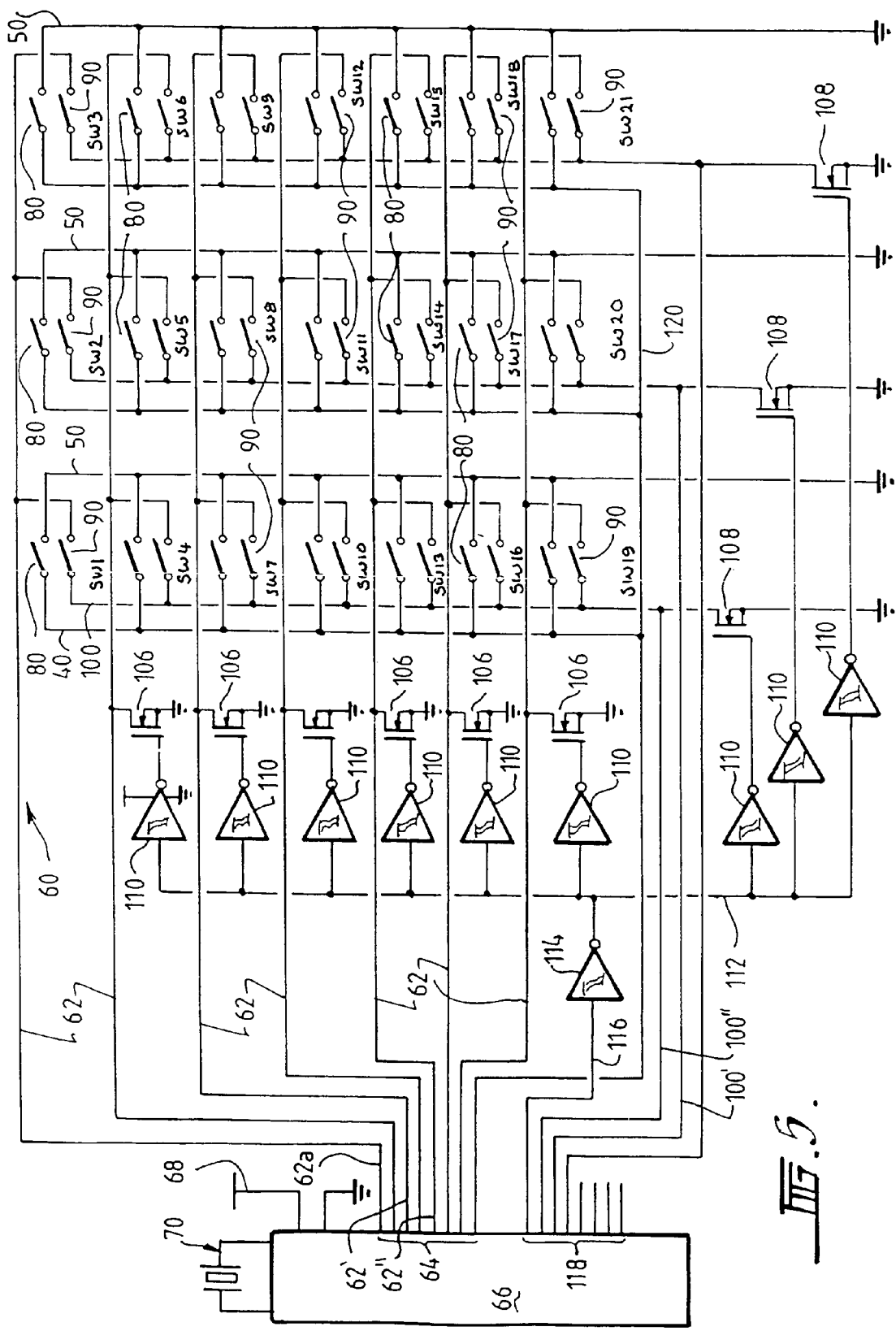
FIG. 5 is a circuit diagram showing a first embodiment of the invention.

FIG. 5 is a circuit diagram showing the keypad 10 of FIG. 1. The keys 12 are identified by reference SW1 to SW21 in FIG. 5 to distinguish between the twenty-one keys shown by reference numeral 12 in FIG. 1. As is apparent from FIG. 5 the keys SW1 to SW21 are interconnected in a matrix electrical connection 60 which includes 7 row lines 62 which are connected to read ports 64 of a microprocessor 66, and the scan lines 100 connected to ports 118 of the processor 66. The microprocessor 66 has usual voltage supply 68 and a crystal 70 for clocking operation of the processor 66. Each of the keys SW1 to SW21 includes the first switch 80 and the second switch 90. As best shown in FIG. 6 which fully show the key SW1 and the key SW4, the first switch 80 is formed by one component comprising contact tab 24' (in FIG. 6) and another component comprising fingers 42 and 52 which extend outwardly from line 40 and 50. The second switch 90 is formed by one component formed by contact tab 24" in FIG. 6 and another component formed by fingers 64 and 102.

Thus, each of the lines 40 carry fingers 42 associated with respective switches 80 and each of the lines 50 carry fingers 52 associated with each of the respective switches 80. Similarly, the lines 62 will carry fingers 64 associated with each of the switches 90.

Each of the lines 62 is connected in parallel with a field effect transistor 106. The column lines 100 are also connected in parallel with further field effect transistors 108. Each of the field effect transistors 106 and 108 is connected to an inverter 110 and each of the inverters 110 is connected to a common line 112 which is coupled to a main inverter 114. The inventor 114 is connected to the microprocessor 66 via line 116. The column lines 100 are connected to scan ports 118 of the microprocessor 66.

The first switches 80 of each of the keys SW1 to SW21 are connected to a common electrical interconnection formed by line 120. The line 120 is connect d to one of the read ports 64 of the microprocessor 66. The line 120 is coupled to the lines 40 shown in FIGS. 4, 5 and 6 which form one side of the first switch 80 and the other side of the first switch 80 is connected to line 50 which in turn is coupled to ground as shown in FIGS. 4, 5 and 6. When a key 12 is depressed the contact tab 24' will bridge the fingers 42 and 52 thereby creating electrical interconnection between the lines 50 and line 40 (and therefore common line 120 thereby connecting the line 120 to ground to change the state of the line 120 to indicate that one of the keys 12 has been depressed).

When one of the keys 12 (i.e. SW1 to SW21) is depressed in FIG. 5 the change of state of line 120 will be read by the microprocessor 66 thereby providing an indication of the depression of one of the keys SW1 to SW21. However, the microprocessor 66 is not able to determine from line 120 which of the keys is actually being depressed because the line 120 is a common line providing a global signal merely indicative of the fact that one of the keys SW1 to SW21 has been depressed but not indicating which of those keys has been depressed. Concurrent with depression of the key 12 and closure of the first switch 80, the second switch 90 will also be closed. Once the microprocessor 66 detects the actuation of the one of the keys 12 by the change of state of line 120, the microprocessor 66 can commence scanning of the lines 100 by outputting scanning signals in turn on each of the lines 100 from ports 118. The lines 62 are read by the microprocessor 66 so that dependant on which of the second switches 90 is closed, a signal, for example a high signal, will be read by one of the ports 64 associated with one of the lines 62 which correspond to the switch 90. Since the processor is able to know which of the lines 120 is being scanned with an output signal and which of the line 62 is being read to determine a change of state signal (for example the high signal) the appropriate one of the switches 90 associated with one of the keys SW1 to SW21 can be determined thereby providing an indication of which of these keys has actually been depressed.

Concurrently with detection of the depression of one of the keys by the change of state of line 120, the microprocessor 66 can output dummy signals on some lines 62 to make some of the lines 62 go high concurrently with scanning signals on some of the lines 120 to thereby indicate dummy key depressions of some of the keys SW1 to SW21. The output of dummy signals on line 64 can take place only between detection of the change of state signal of line 120 and scanning of lines 118 so that the dummy signal has a duration which is identical with the scanning of the actual depressed key so that there is no substantial time difference between signals provided by the actual depression of one of the keys and the dummy depression of keys produced by the processor 66. Thus, anyone attempting to break into the key pad and extract data from the line 62 and lines 120 with a view to determining which keys have been depressed, will not be able to ascertain this because information not only of the keys which have been depressed but also of the dummy depressions will be obtained with no ability to distinguish between the actual dummy depressions and the real depressions so that the actual data fed into the keypad cannot be determined.

Between scanning of the matrix 60 after the receipt of a change of state signal on line 120, the micro-processor 66 outputs a high signal on line 116 so that the inverter 114 supplies a low signal to each of the plural inverters 110 which in turn supply a high signal to the field effect transistors 106 and 108. This pulls the field effect transistors low so that the lines 62 and 100 are maintained low. Thus, if an attacker attempts to apply a scanning regime to the lines 62 and 100 with a view to using that scanning regime to determine which keys have been depressed, the low state of the lines 62 and 100 will overwrite any signals applied to the lines thereby maintaining the lines 62 and 100 at a low state thereby not enabling the attacker to implement its own scanning regime.

In one method of using the embodiment of FIG. 5, all of the read lines 62 and scan lines 100 are initially set low by the microprocessor 66 and the microprocessor 66 awaits a change of state signal on line 120 indicative of one of the keys SW1 to SW21 being depressed. When a signal is received on line 120 indicative of one of the keys being pressed, the processor 66 sets the scan lines 100 high in turn. The read lines 62 are then read and if one of the read lines 62 is high this is indicative of the read line 62 being connected to a scan line 100 by closing of the second switch 90 of one of the keys SW1 to SW21. By knowing which read line 62 and which scan line 100 is involved the appropriate key can be identified. In order to disguise which key is actually being pressed, the processor 66 can output dummy press signals on the read lines 62 by making the read lines 62 go high in a random order. For example, if it is assumed that key SW2 is pressed, when the scan line labelled 100' in FIG. 5 goes high scan line 62a in FIG. 5 will also go high. However, dummy presses can be produced by causing, for example, scan lines labelled 62' in FIG. 5 to go high. Thus, during the scanning regime when the scan line labelled 100" in FIG. 5 goes high because a dummy high signal has been applied to line 62' it will appear as if keys SW7 and SW13 have been depressed. The processor knows of course that the signals on line 62' are dummy presses and therefore need not register those as actual key presses. Thus, in a first scanning regime through the key pad it might appear to anybody observing that the abovementioned keys have been pressed when only the key SW2 has been pressed. The highs on the scan line 62 indicating dummy presses can be changed randomly so that for each scan through the pin pad different dummy presses are produced. Scanning can be completely stopped as soon as the real button which is pressed is released which causes the line 120 to again change its state providing an indication to the processor 66 that the key has been released and therefore no further scanning is required until another key is pressed. The sets of high signals on the lines 62 whether dummy signals or real presses will last for exactly the same length of time because the time period will be set by the time each of the scan lines 100 is set high in turn and the real press and the dummy presses will disappear after the respective scan line 100 goes low. Thus, there is no way based on a time consideration of determining which of the keys is actually pressed and which are dummy presses.

Figure 7A:
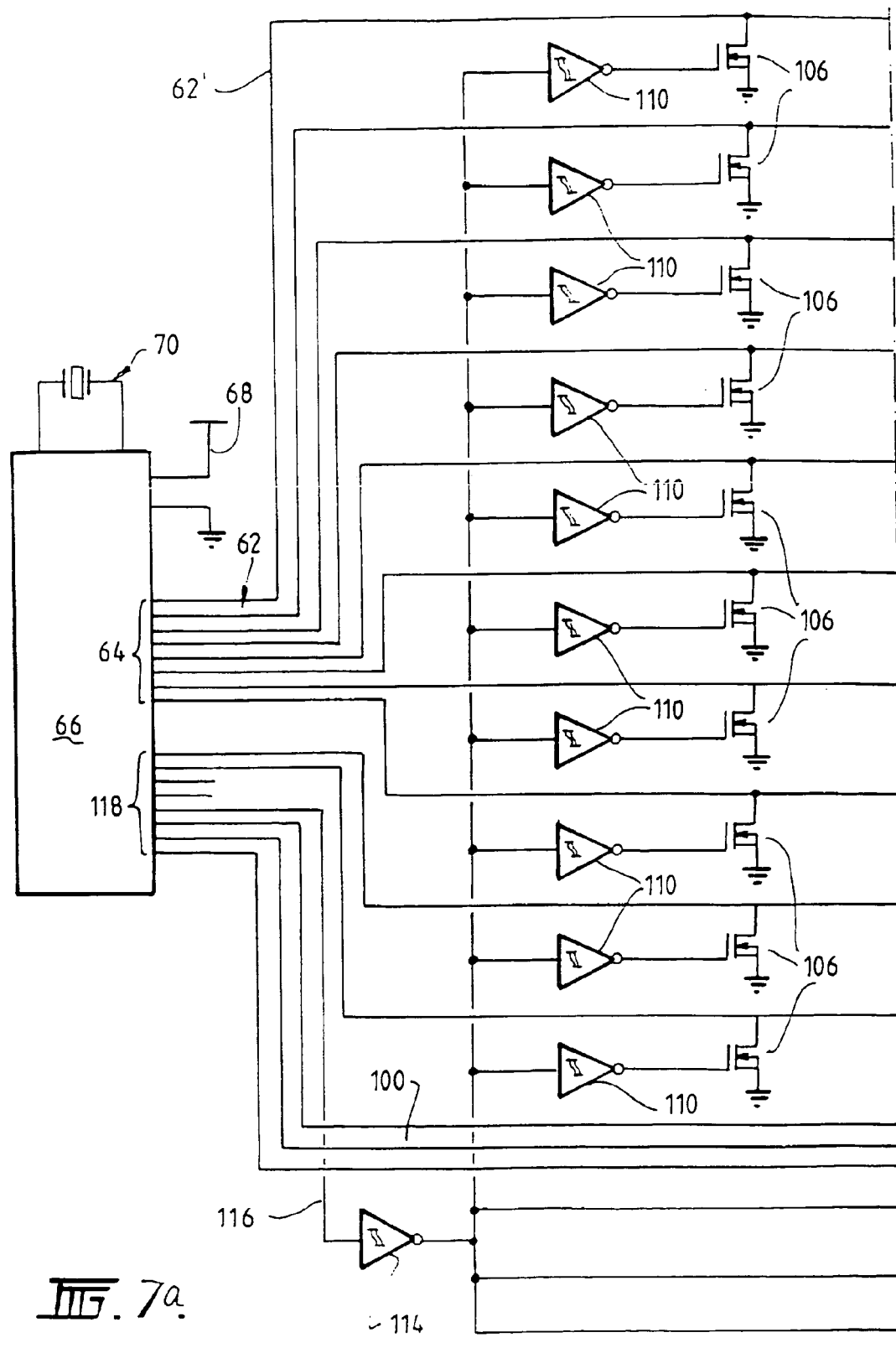
FIG. 7*a* and 7*b* show a second embodiment of the invention.
Figure 7B:
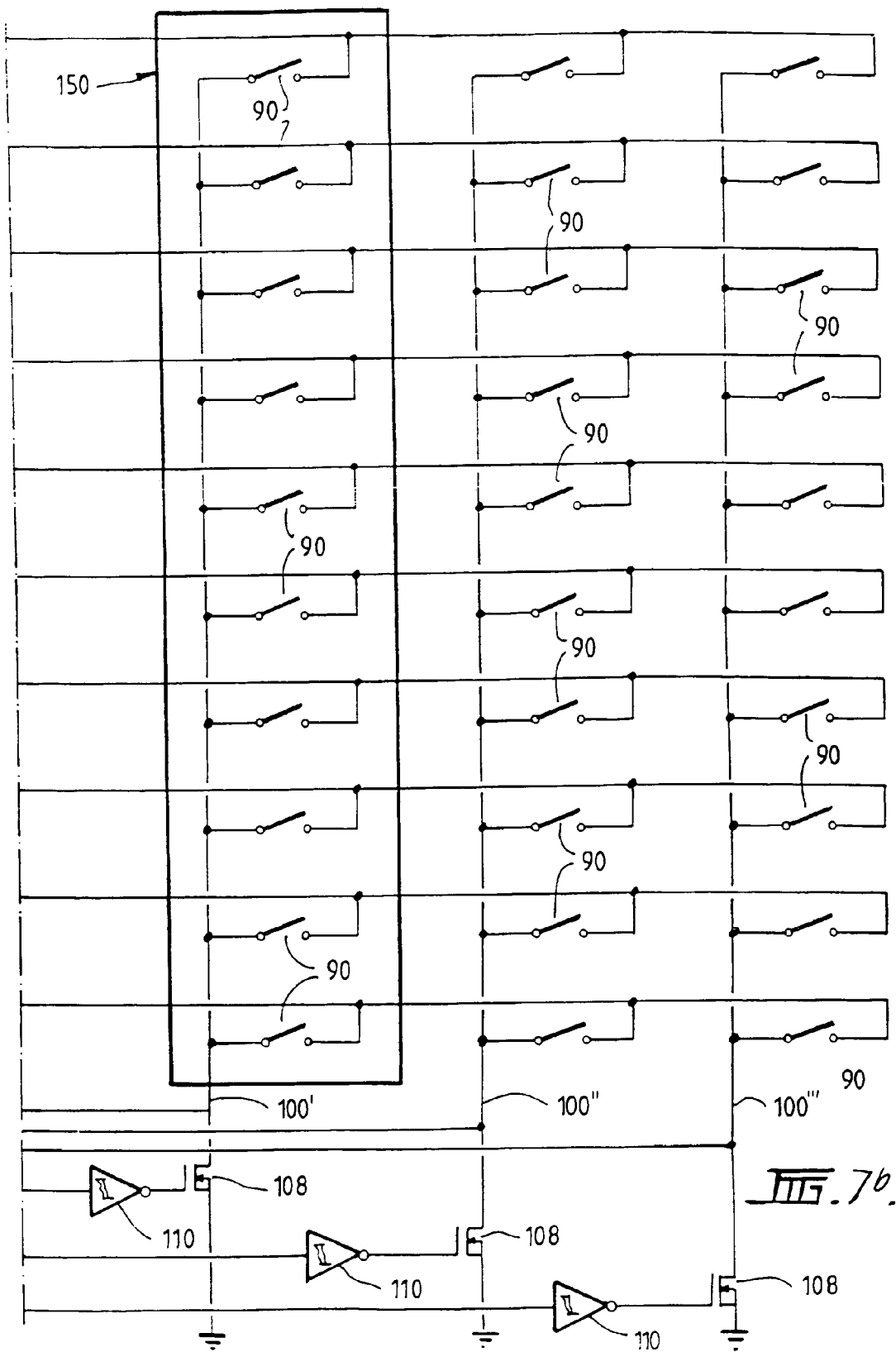

FIGS. 7a and 7b shows a second embodiment of the invention in which like reference numerals indicate like parts to those previously described. However in this embodiment there are thirty keys marked SW1 to SW30 and each key has a single switch instead of two switches as in the case of the previous embodiment. The single switch of the keys SW1 to SW30 is configured in exactly the same manner as described with reference to FIGS. 1 to 4 and 6 expect that only a single contact pad 24 is included in the key 12 and a single intermeshed array of fingers 64 and 102 (not shown in FIG. 9) arranged on the circuit board 30 below the block 16 for contact by the contact pad 24 to close the switch.

Figure 8:
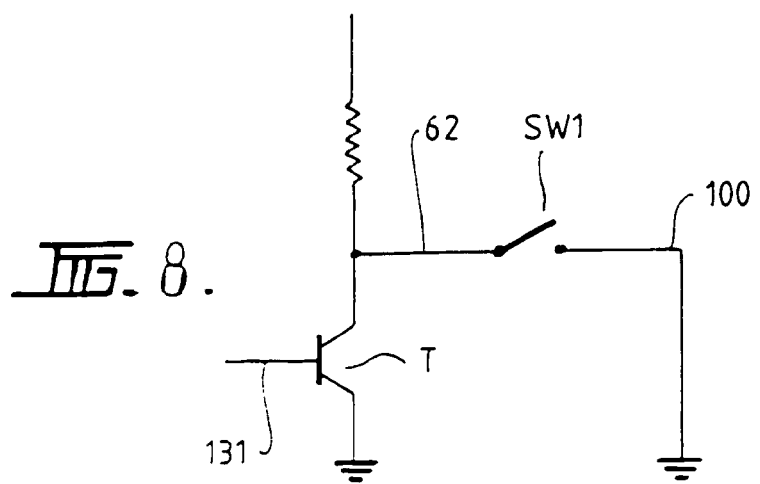
FIG. 8 is circuit diagram to assist explanation of the embodiment of FIGS. 7*a* and 7*b*.

In this embodiment the ports 64 and 118 of the processor 66 are formed by open drain circuits and therefore comprise open drain ports. Put simply, an open drain circuit is one that outputs a strong logic low, but a weak logic high (often requiring an external component such as a resistor to assist in raising the level to a logic high). Thus, a high open drain output may be overridden by a low signal from another circuit if they are connected together. For example, FIG. 8 shows a schematic view of an open drain circuit in which a transistor T has a base 131. A low signal produced by the processor on line 131 will switch transistor T on and line 62 will be high if the key SW1 is open as shown in FIG. 10. However, if the key SW1 is closed the open drain circuit of FIG. 8 will cause line 62 to immediately go low notwithstanding that a low signal is applied to the base 131. Thus, if a low signal is applied to the base 131 and output to line 62, if the signal on line 62 is read as high this is indicative of the fact that the key SW1 is not actuated, but if the line remains low notwithstanding the fact that the controller has attempted to make the line go high by the signal on line 131 then the controller knows that the key SW1 has been depressed. When it is desired to output a high signal on one of the lines from the processor which is associated with an open drain circuit, the processor switches off the open drain nature of the port to enable the high signal to be provided from that port, and when it is again desired to reinstate the open drain circuit the open drain is again opened by the processor. The open drain nature of the port can be switched off by applying a voltage across the aforesaid resistor in order to assist in raising the level to a weak logic high. It will be appreciated that the circuit shown in FIG. 10 apart from the line 62, key SW1 and line 100 are integrated into the ports of the processor 66 to which the lines 62 and 100 are connected.

In the embodiment of FIGS. 7a and 7b the keys SW1 to SW30 have switches 90 which, as mentioned above, are identical to the switches 90 previously described.

Generally security of keypads is more concerned with the numeric keys on the keypad because those are the keys which will be used to enter secret data such as pin numbers and the like which must be kept secure. In the embodiment of FIG. 7b all of the numeric keys of the pinpad are arranged in one column identified by the block 150 in FIG. 7b. Thus, these keys are represented by the keys SW1, SW4, SW7 SW10 . . . SW28. When the microprocessor 66 attempts to collect a pin number from the keypad shown in FIG. 7b the processor 66 commences its scan regime. The microprocessor 66 initially sets all of the read lines 62 low and all of the scan lines 100 low. However, assuming that the keypad is arranged as shown in FIG. 7b in which all of the numeric keys are in block 150 only the line 100 which relates to those keys need be held low.

The processor 66 then attempts to set the read lines 62 high one at a time and in random order. This is done by switching off the open drain of the port associated with the line 62 by charging the aforesaid resistor. This step is done automatically in the processor 66 under software control in accordance with the operating regime of the processor 66. All of the other read lines are kept low. After attempting to set one of the read lines 62 high, the processor 66 then reads back the state of that read line to determine if it is indeed high. If the switch 90 associated with that read line which is attempted to be set high has been actuated by depression of its associated key then the line 62 will not in fact have gone high because of the open drain nature of the port of the processor 66 to which the scan line 100 associated with the pressed key is connected which pulls the line continuously low notwithstanding the fact that the controller 66 is attempting to make the line go high. That is, the open drain port of the scan line 100 associated with the block 150 will override the high signal produced by the processor 66 thus maintaining the read line 62 in a low state. Thus, the processor 66 will know if a key has been pressed on that read line because the read line will stay low if the key has been pressed. This cycle is continued until a valid keypress is determined.

If the numeric keys are not associated with the same scan line 100 but are in fact on different scan lines 100, such as being comprised by the keys SW1 to SW10 in FIGS. 7a and 7b, the same procedure as described above occurs except that the processor must now determine which of the scan lines relates to the depressed key. The processor will know which of the read lines 62 is associated with the pressed key. This could be any of three keys because up to three keys are on the same read line 62. The scan line 100 is determined in the same manner as the read line described above with one small difference in that only the scan lines which are of interest need be tested. In this example if switches SW1 to SW10 are the numeric keys then all of the scan lines 100 need to be tested. If the numeric keys were arranged only on two of the scan lines then only those two scan lines need be tested.

The processor 66 sets all of the read lines 62 low and then proceeds to attempt to set the scan lines 100 high one at a time and in random order. All the other scan lines 100 are kept low. The processor 66 then reads back state of the scan line to determine if it has indeed gone high. Once again, if the line has gone high it indicates that a key has not been depressed but if the line stays low notwithstanding the attempt to make it go high then this indicates that a key has been pressed. This process is repeated for all of the scan lines until the key press has been determined.

Once both the read and scan lines upon which the key lies has been determined (and thus the exact key pressed has been identified), then the read lines 62 are kept in their low state and scan line on which the key lies is kept high (all of the other scan lines are kept low). Therefore the state of depression of the key may be determined by the processor by monitoring the level of the scan line. When the key is released the scan line will go high.

As in the earlier embodiment, main inverter 114, and plural inverters 110 together with associated field effect transistors 106 and 108 are connected in parallel with the keys SW1 to SW30 so as to drive the lines 62 and 100 low between scanning regimes for the same reason as previously described.

The field effect transistors 106 and 108 previously described also perform the important function in this embodiment of absorbing any spikes which may occur on the read and scan lines should the ports of the processor 66 not entirely be open drain ports. That is, it is possible that even though the intention is to make the ports open drain ports, a small spike may occur on the lines when the lines are attempted to be made high. Although the open drain nature of the ports will quickly pull the ports low it is possible that a high spike may be produced and if so the spike will be absorbed by the transistors 106 and 108 and therefore not appear as a signal which would be observed or readily detected by an attacker.

Furthermore, the field effect transistors 106 and 108 also serve to ensure that signals can appear on the lines 62 and 100 simultaneously when required. For example, it is desired to set some of the read lines 62 high and one of the scan lines 100 high, if the read lines 62 are set high for the scan lines (possibly to produce dummy presses as in the embodiment of FIG. 5) the occurrence of those high signals before a scan signal may provide some basis for distinguishing dummy presses from real presses. However, if the transistors are on, the lines will not go high until the transistors 106 and 108 are turned off by a signal on line 116. Thus, as soon as a signal on line 116 is provided all of the lines which are attempted to set high by the processor 66 will go high simultaneously because all of the transistors 106 and 108 will be turned off simultaneously by a signal on line 116.

In the embodiment of FIGS. 7a and 7b, to assess the ability of the scan regime of this embodiment to hide any valid key press, we will now examine what an outside observer would see with the keypad of FIGS. 7a and 7b. It will also be assumed that the numeric keys are connected on a number of the scan lines 100 rather than on one line in the block 150. However, the same considerations apply regardless of whether the numeric keys are in the block 150 or spread over all of the scan lines 100.

1. The CPU 66 is commanded to accept a PIN, and starts its obfuscated scan regime, setting the read lines 62 high in a random order whilst the scan lines 100 stay low. The outside observer will see a flurry of activity on the read lines 62 as they are set high randomly.
2. The operator of the keypad now presses a key (e.g. the number 2 represented by, for example, key SW2).
3. The activity on the read lines 62 will continue only until read line 62' is attempted to be set high by the CPU 66, at which point it will stop (as the CPU will know that a key is pressed on this line). The outside observer will see only the activity on the read lines 62 stop, as the are all suddenly set low. As the read lines are scanned in a random order, no information may be gained from the knowledge of the last read line scanned (it could even be read line 62', with the key press occurring between the current scan and the last scan). No information may be gained from watching read line 62', as it will simply stay low when it is scanned, and thus look identical to the other, non-scanned, read lines.
4. With the read line determined, all the read lines 62 are set low. The outside observer can still see no change on the key pad.
5. The scan lines 100 are then scanned by the CPU 66 in a random order. Here the observer may gain some information on the key presses, as if the scan starts with scan line 100', the observer will see this line go high-thus revealing that the key does not exist on this line. If the scan starts with line 100", the observer will gain no further information about the key presses; all scan lines 100 will stay low (scan line 100' and 100''' are set low by the CUP 66 and scan line 100" is over-ridden by the low signal on the rad line 62 it is connected to via the switch 90 of key SW2).
6. The scan line is kept high by the CPU, and the read lines re kept low.
7. The operator of the keypad releases the key. The scan line 100" that the key existed on suddenly goes high, revealing to the outside observer what scan lines the key was on. This is all the information that the observer can gain, however, and it can be seen from the key layout that this reveals only a number of choices as to what the key may have been, not exactly what the key was.
8. The scan regime returns to testing the read lines, until the whole PIN has been entered (e.g. the OK key is pressed).

If the keypad layout is as per the embodiment of FIG. 7b where the numeric keys are all in the block 150 then the observer will know which scan line a key is actually associated with because only one scan line is associated with all of the numeric keys. However, the observer will not obtain any information as to which read lines are associated with the keys for the same reason as discussed above and therefore the exact keys which are actually depressed upon entry of the PIN code cannot be determined.

A further and most preferred embodiment of the invention includes a combination of the embodiments of FIGS. 5 and 7a and 7b in which the scanning protocol described with reference to FIGS. 7a and 7b and the open drain circuit feature of that embodiment are included in the embodiment of FIG. 5, thus the embodiment of FIG. 5 can utilize the two switch feature associated with each key and also the open drain circuit feature and scanning regime described with reference to FIGS. 7a and 7b for additional security purposes.

FIGS. 9 and 10 are flow charts illustrating the operation of the embodiment of FIG. 5 but including the scan regime and open drain concept of FIGS. 7a and 7b. As explained above, initially the processor 66 supplies a signal to field effect transistors 106 and 108 to pull lines 62 and 100 low (step 901).

The processor 66 then monitors for a change of state on line 120 (step 902). When a change of state occurs by the depression of one of the keys 12, the processor 66 pulls all lines 100 low and all but one of the read lines 62 low whilst the transistors 106 and 108 are on (step 903). The processor 66 then supplies a signal on line 116 to switch the transistors 106 an 108 off(step 904). Up until this time although the processor is attempting to put a high signal on one of the read lines 62 that line 62 will not actually go high until the transistors 106 and 108 are turned off because the transistors 106 will simply pull the signal low on that line while they are turned on. This enables the high signal on read line 62 and the high signal on one of the scan lines 100 to appear simultaneously assuming that a key associated with the read line has not been pressed. Read line 62 which is not high (i.e. the one that has not been pulled low) will rise to the high state if it is not connected to the scan line by pressing of the key 12. The processor 66 therefore determines whether the relevant scan line 62 is high (step 906). If no this indicates that a key has been depressed on the scan line. This is because of the open drain nature of the ports and once the read line 62 is connected to a scan line 100 by the pressing of a key 12, the open drain nature of the port will keep the line low notwithstanding the fact that the processor attempts to drive the line high. If the line 62 is high this indicates that a key has not been depressed because the line has gone high as expected. This is because the line 62 is not connected to one of the scan lines 100 by the pressing of a key and therefore the line is able to be driven high by the microprocessor 66 and not pulled low by an open drain. The processor 66 then turns the transistors 106 and 108 back on and the system returns to step 903.

If at step 906 the result is no indicating that the relevant line 62 is not high this indicates that a key on the line has been pressed because the line which should have gone high is now connected to the scan line which is low. Thus, at step 908 the processor 66 knows which of the read lines 62 is associated with a depressed key.

The system continues after step 908 to step 910 at which the processor 66 pulls all of the read lines 62 and all but one of the scan lines 100 low with the transistors 106 and 108 being turned on.

At step 911 the transistors 106 and 108 are turned off and the processor 66 at steps 912 determines whether the scan line is high. If yes at step 912 the processor determines that no key is pressed. If the answer to step 912 is no this indicates that a key has been depressed at step 914. Thus, at step 915 the processor now knows which scan line and which read line is associated with a depressed key and therefore can determine which of the keys 12 (SW1 to SW21) has in fact been depressed. The system then moves to step 916 and halts scanning and turns all of the transistors 106 and 108 on and then the system returns to the start to look for depression of the next key. After steps 913 which indicated that no key had been pressed the systems moves to step 916 and the processor 66 turns the transistors 106 and 108 on and the system returns to step 902 so a different one of the scan lines 100 is made high with the others being pulled low. The system then continues until the appropriate scan line is determined and therefore the depressed key is detected.

In this embodiment which uses both the open drain concept and the double switch concept of FIG. 5, real dummy presses are not actually produced by the processor 66. Rather, in this arrangement virtual dummy presses are generated because when an actual key is pressed the read line 62 stays low notwithstanding the fact that the processor 62 attempts to make the line go high. Thus, since all other lines are kept low there is effectively no difference caused to the read lines by the attempt to make the read lines 62 associated with the pressed key go high and the other read lines 62 which are low. All lines are low because the line which is attempted to be made high stays low because of the connection of the line to the scan line 100 by the pressed key and the open drain circuit. Thus, in effect all of the lines 62 are supplied with virtual dummy presses because the signal on line 62 not associated with a press is exactly the same as signals on the line 62 associated with a press this is therefore similar to a situation that if the line 62 associated with a press was actually allowed to go high and all of the other lines where made high by a dummy press output from the processor 66.

Microprocessor 66 is also coupled to a display (not shown) and other support devices and chips such as memory and the like. The display is used to display information such as the input commands imputed into the keys of the keyboard. The display interacts with the processor 66 in a conventional fashion as does the additional support devices and chips and therefore are not described. If desired, a further microprocessor (not shown) could be connected to the microprocessor 66 by a serial interface to provide communication to a telephone network such as the PSTN network for transmission of data from the keypad to a financial institution, or, coupled with a wireless transmitter for over the air transmission of the data to a financial institution.

Figure 11A:
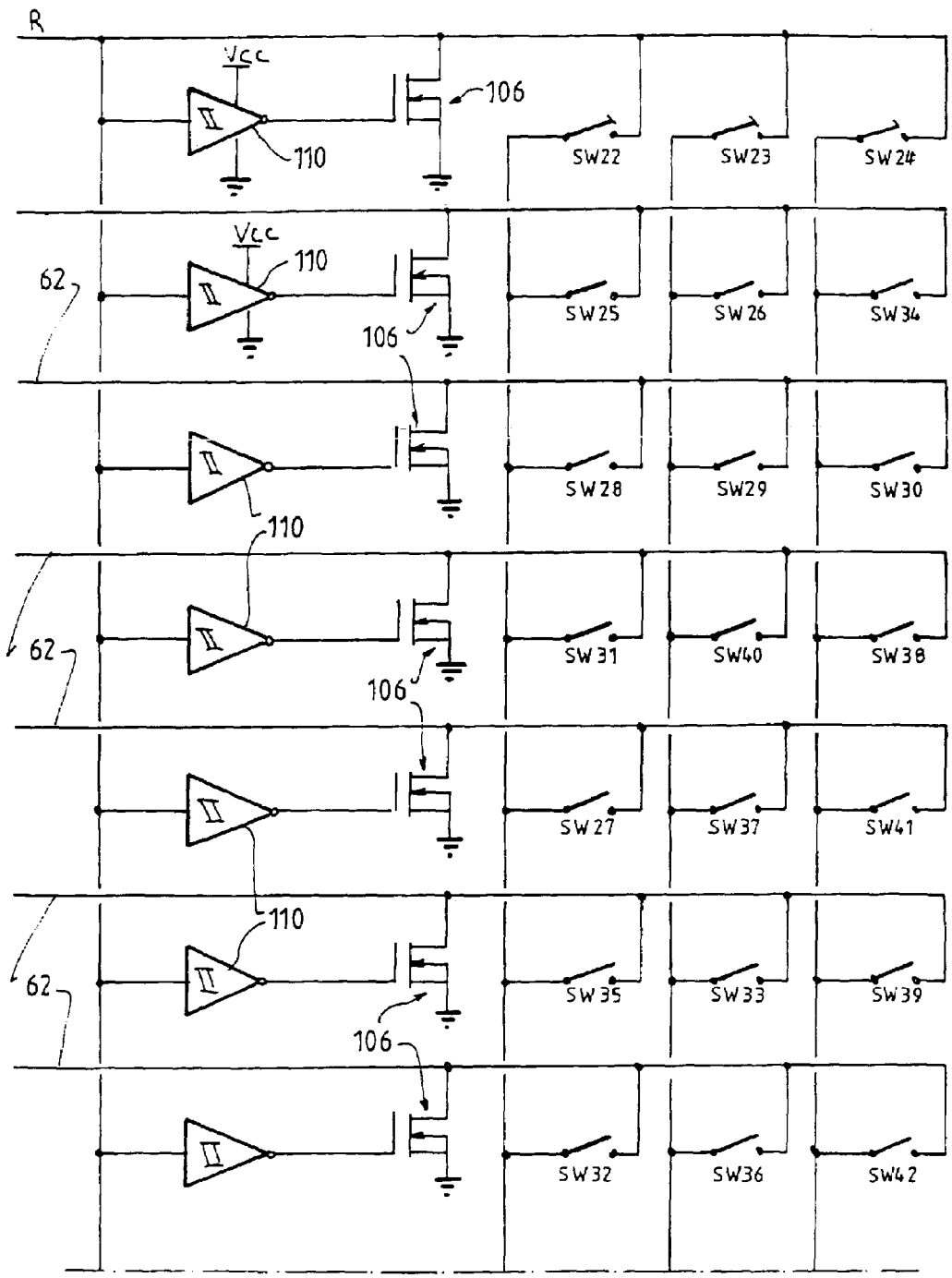
FIGS. 11*a* and 11*b* show a still further embodiment of the invention.
Figure 11B:
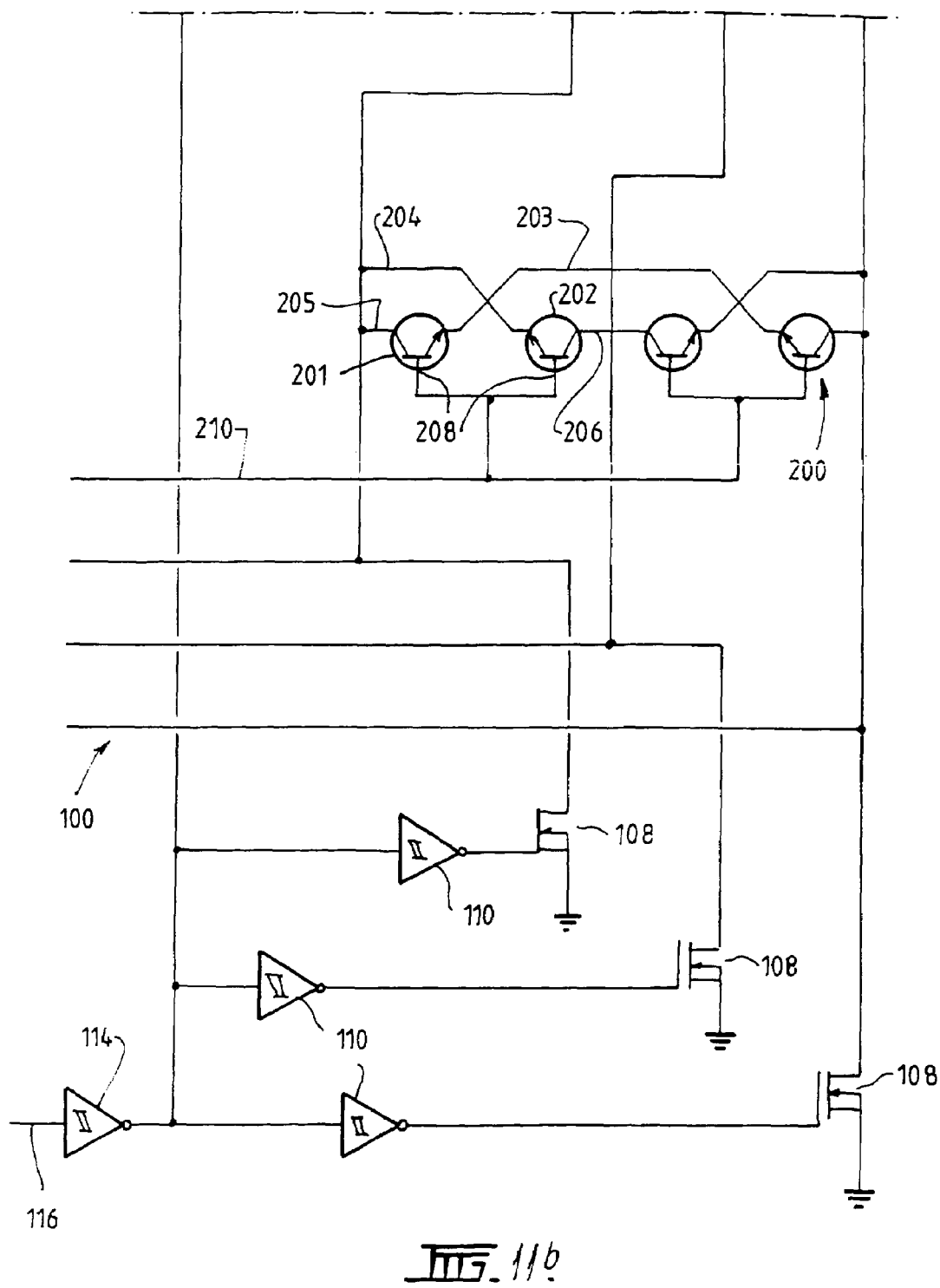

FIGS. 11a and 11b show a still further embodiment of the invention which is similar to the embodiment of FIGS. 7a and 7b except that the keys of interest are provided in a number of columns and coupled to different scan lines. This embodiment provides an improved method of providing keys spread over a number of scan lines compared to that which is described with reference to FIGS. 7a and 7b.

Like reference numerals indicate like parts to those described with reference to FIGS. 7a and 7b. In FIGS. 11a and 11b the microprocessor 66 is not shown simply for ease of illustration. However, it should be understood that the read lines 62, scan lines 100 and line 116 are connected to the same ports of the microprocessor as shown in FIGS. 7a and 7b. As explained, in this embodiment the numeric keys of interest which will be used to input pin codes or other security information are spread over all of the scan lines 100 rather than being provided in a single block on one scan line as in FIGS. 7a and 7b. The individual keys 12 in this embodiment are identified by references SW22 to SW42.

In this embodiment of the invention the scan lines 100 are tied together by electrical ties 200. The electrical ties 200 in the embodiment shown comprise crossed transistor pairs having a first transistor 201 and a second transistor 202. The transistors 201 and 202 have their emitters connected to respective scan lines 100 by lines 203 and 204 and the scan line 100 to which the emitter of transistor 202 is connected, is connected to the collector of transistor 201 by line 205. Similarly the collector of transistor 202 is connected to the scan line 100 to which the emitter of transistor 201 is connected by line 203, and the line which connects the collector of transistor 202 to the scan line 200 is shown by reference to 206. Each transistor 201 and 202 has a base 208 connected to control line 210. The control line 210 is connected to an appropriate port of the microprocessor 66 (not shown in FIG. 11) from which control signals can be output to switch the transistors 201 and 202 on and off selectively as will be described in more detail hereinafter.

The two cross transistor pairs shown in FIG. 11 therefore couple all three scan lines 100 together when the transistors are switched on by a signal on line 210. Thus, when a signal does appear on line 210 the transistors 201 and 202 conduct so that the lines 100 are all effectively coupled together. When the transistors 201 and 202 are switched off by removal of the signal on line 210 the scan lines 100 are effectively isolated from each other so that signals can be applied to the individual scan lines from the microprocessor 66.

Thus, according to this embodiment of the invention an output control signal is applied from the microprocessor 62 to the line 210 to switch each of the transistors 201 and 202 on so that the scan lines 100 are effectively coupled together. If the read lines 62 are then all held in a low state for example, and the scan lines are held in high state, when one of the keys 12 identified by the switches 90 (SW22 to SW42) is pressed this will cause a connection between all of the scan lines 100 and at least one of the read lines 62 (associated with that key which is being depressed) thus pulling all of the scan lines 100 low. This constitutes a signal that one of the keys on the keypad has been pressed. The electrical ties 200 which tie the scan lines 100 together are then switched off by removal of the signal on line 210 so that each of the scan lines 100 is effectively isolated from the others. This enables scanning signals to be supplied by the microprocessor 66 to each of the scan lines 100 in turn so as to determine which of the scan lines 100 is associated with the pressed key. Once the scan line is determined the read lines 62 associated with the pressed key can be determined in the same manner as described with reference to FIG. 7. That is, the open drain nature of the ports of the processor 66 will hold the scan line 62 low notwithstanding an attempt to make them high. After attempting to set one of the read lines 62 high, the processor 66 then reads back the state of that read line to determine if it is indeed high. If the switch 90 associated with that read line which is attempted to be set high has been actuated by depression of its associated key then the line 62 will not in fact have gone high because of the open drain nature of the ports of the processor 66 pulling the line continuously low notwithstanding the fact that the controller 66 is attempting to make the line go high. Thus, the processor 66 will know if a key has been pressed on that read line. If the line does go high this indicates that the key has not been pressed because the read line 62 is not connected to the open drain port of the processor 66 by depression of the key and connection of that read line 62 to the open drain port by the appropriate scan line 100. Once both the scan and read lines have been determined and therefore the depressed key has bee determined, electrical ties 200 are switched back on reconnecting the scan lines 100 together again. The whole circuit is then placed into the same state as before the key press but the scan lines are still held low by the connection between the scan lines and a read line via the key which has been depressed. When the key is released, the scan lines will no longer be held low by a connection to a read line 62 and therefore they transition high. This constitutes the global signal that the button has been released.

Since the electrical ties 200 are switched on and the lines 100 are connected together when another key is pressed the same sequence of operations will take place and as soon as that key is pressed the scan lines 100 are connected to one of the read lines 62 thus pulling all of the scan lines 100 low. The same procedure as described above can then be used to determine the key which has been pressed. In other embodiments, rather than using a cross transistor pair as the interconnection between the scan lines 100, a field effect transistor can be connected between the scan lines 100 to perform the same function.

Figure 12:
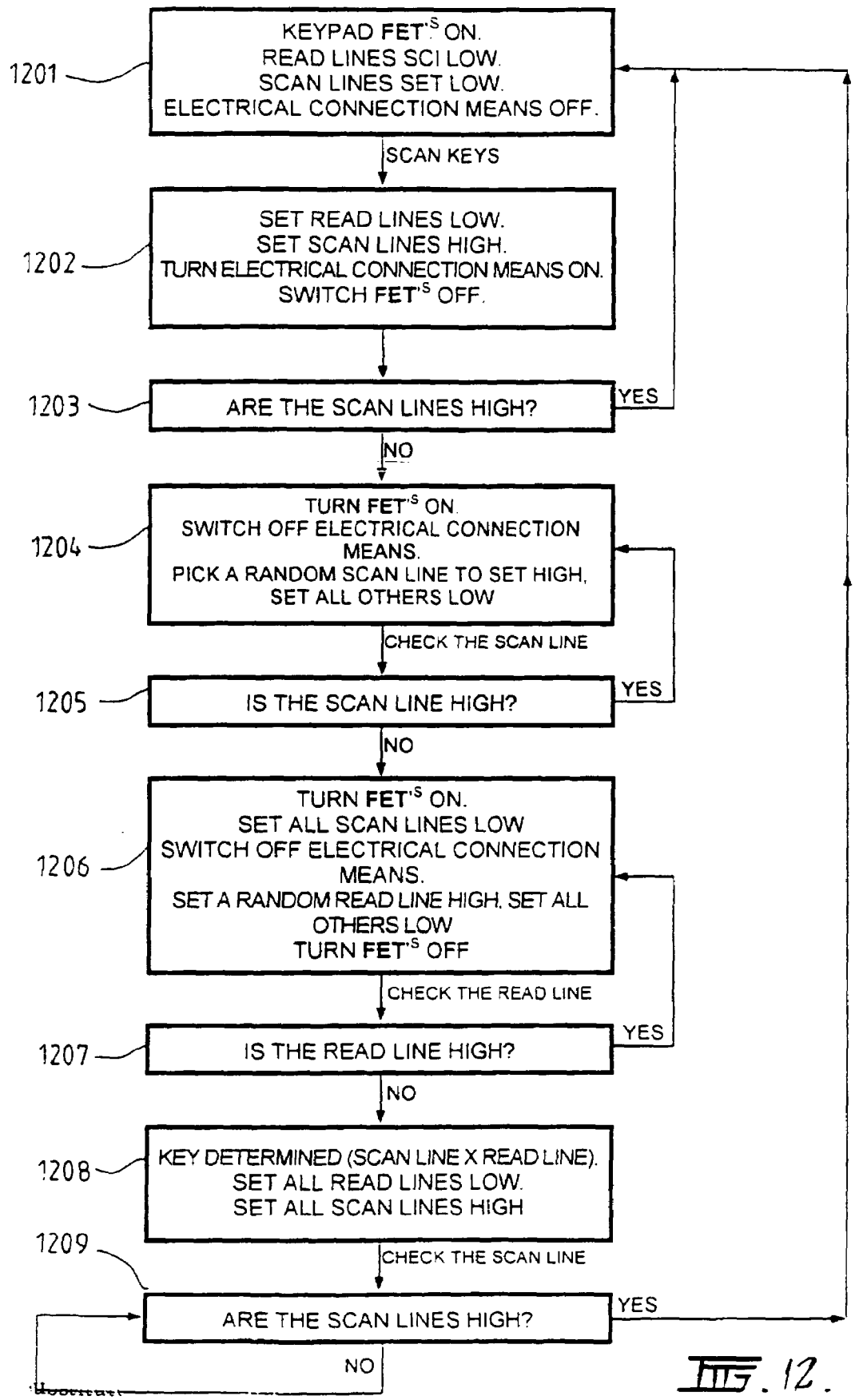
FIG. 12 is a flow chart explaining the operation of FIGS. 11*a* and 11*b*.

FIG. 12 shows a flow chart which further explains the operation of the embodiment of FIG. 11.

At step 1201 the transistors 106 and 108 are switched on and the read lines 62 and scan lines 100 are set low. The ties 200 are switched off. In order to commence the scan in step 1202 the read lines 62 are maintained low and the scan lines 100 are set high. The electrical connection formed by the ties 200 is switched on by a signal on line 210 so that the scan lines 100 are all connected together. The transistors 106 and 108 are then switched off.

At step 1203 a determination is made by the processor 66 as to whether all of the scan lines 100 are still high. If the answer is yes then no key has been pressed and the process returns to step 1201. If the answer is no indicating that the scan lines have gone low thereby indicating a key has been pressed, the process then moves to step 1204. In step 1204 the transistors 106 and 108 are turned on and the ties 200 are switched off by stopping the signal on line 210 which held the transistors 201 and 202 in an on condition. One of the scan lines 100 is then set high and all of the others are set low.

In step 1205 a check is made of the scan line to determine if the scan line is high. If the scan line is high no key has been pressed on that line and the process returns to step 1204 and another scan line is set high whilst all the others are set low. If the answer at step 1205 is no indicating that the scan line has gone low this indicates the key has been pressed on that scan line.

The process then moves to step 1206 and the transistors 106 and 108 are switched on and all of the scan lines are set low. The electrical ties 200 are is switched on by a signal on line 210 to connected all of the scan lines 100 together. The read lines 62 are then set high in random order with one read line being set high and the others being set low and the transistors 106 and 108 are switched off.

In step 1207 the read line is checked to determine if the read line is high. If the answer is yes this indicates that no key has been pressed and the process returns to step 1206 at which another of the read lines is randomly set high whilst all others set low. If the answer is no indicating that the read line has gone low this indicates that a key has been pressed and notwithstanding the fact that the processor is attempting to make the line go high the line is being held low by virtue of its connection to the scan lines 100 via the pressed key and the open drain nature of the port to which the scan line 100 is connected.

If the answer to step 1207 is in the negative the process then moves to step 1208 where the actual key depressed has been determined because the scan line and read line associated with the key are now known. All of the read lines are then set low and all of the scan lines are set high and at step 1209 a check is made to determine whether all of the scan lines are high. If the answer to this step is no this indicates that the key is still pressed and the system continues to check to determine if the scan line is high. When the scan lines goes high this indicates that the key has been released and the process returns to step 1201 to determine the next key which is pressed by a user.

It should be understood that as in the embodiment of FIG. 7 the read line which is associated with the pressed key is determined by attempting to make the read line 62 go high but the read line not actually going high because of its connection via the closed key to the scan lines 100 which are in turn connected to an open drain ports which continually pulls the line low. Thus, it is the fact that the line does not actually go high which indicates that a key has been depressed and this indication is not apparent to anyone attempting to monitor the signals on the various lines to determine which key has been pressed because there is no change in state of the line.

The random scanning routing through the various read lines 62 will occur numerous times for each key depression. For example the scanning routing may take ten milliseconds whilst a normal key depression when a user touches one of the keys 12 will last for approximately ½ to ¾ of a second. Thus, numerous complete scans through all of the lines can take place in this time to enable the processor 66 to determine which of the keys has actually been pressed. On probability, the key will be found within the first few attempts to make one of the lines 62 go high. Once the key is determined a user monitoring the line 62 will know which have gone high and therefore which keys have not been depressed but several of the lines 62 will have remained low including that which is associate with the pressed key and therefore the user will not know which of the lines 62 is associated with the pressed key. If by chance, all of the lines 62 are made to go high before the actual line 62 is identified (ie the line associated with the pressed key is scanned last and all the other lines have gone high) then the user will know which line is associated with a pressed key and may be therefore able to determine the key which has been depressed. However, the probability of this occurring is extremely small and the probability of this occurring for all depressions of a key in order to enter security information is miniscule thereby making it virtually impossible for anyone to determine which keys have been pressed.

Since modifications within the spirit and scope of the invention may readily be effected by persons skilled within the art, it is to be understood that this invention is not limited to the particular embodiment described by way of example hereinabove.

The claims defining the invention are as follows:

1. A keypad including;
   a plurality of keys for actuation by a user to input data into the keypad;
   a matrix electrical interconnection interconnecting the keys so that actuation of a key can be detected by scan signals applied to the matrix and by reading signals from the matrix electrical interconnection;

control means for causing the matrix electrical interconnection to change state independently of the depression of a key to thereby disguise which of the keys has been pressed, and to interrogate the matrix electrical interconnection having regard to the caused change of state of the keys to determine which of the keys has actually been pressed; and state actuating means for causing the matrix interconnection to take up a predetermined state when a key is pressed to prevent the identity of the pressed key from being determined by an outside observer attempting to determine the duration of depression of the pressed key, wherein the matrix electrical interconnection includes a plurality of read lines and a plurality of scan lines, the scan lines and read lines being interconnected by the keys so that when a key is depressed a scan line is connected to a read line, and wherein the scan lines are connected to open drain ports of the control means so that when the scan lines are connected to a read line by the depression of a switch the read line will maintain a predetermined state notwithstanding the control means attempting to change the state of that read line, and wherein the control means applies signals to the read lines to make the read lines change state and identifies a read line associated with a depressed key by the read line not changing state when an attempt is made to make the read line change state because of the connection of that read line to the open drain port via the depressed key.

2. The keypad of claim 1 wherein the control means is for outputting dummy signals on the read lines so that the read lines are caused to change state in random fashion so that a change in state of a read line upon depression of a key is one change in state amongst many changes of state of the read lines and, wherein, since the control means knows which of the read lines has been caused to change state by dummy signals the control means can determine which of the lines has changed state not due do to a dummy signal and therefore which of the read lines is associated with a pressed key.

3. The keypad of claim 1 wherein all of the keys are connected to a single scan line.

4. The keypad of claim 1 wherein the keys are associated with a plurality of different scan lines and the scan lines are interconnected by electrical interconnection means so that when the electrical interconnection means is switched to a first state all of the scan lines are connected together so that depression of a key will cause one of the read lines to change state thereby indicating that a key has been pressed and whereupon the electrical interconnection means has its state changed by the control means so that the scan lines are disconnected one from the other so that scan signals can be applied to the scan lines to enable the scan line associated with the pressed key to be identified and wherein the controller attempts to change the state of the read lines so that the read lines change state if they are associated with keys which have not been pressed and if the read line is associated with a key which has been pressed the read line does not change state because of connection to an open drain port of the control means via the pressed key to thereby enable the control means to identify the read line which is associated with the pressed key.

5. The keypad of claim 1 wherein a plurality of scan lines are connected together by electrical connection means in order to identify depression and release of a key and the electrical connection means disconnects the scan lines one from another so that a scanning regime can be initiated to determine which of the scan lines is associated with a pressed key.

6. The keypad of claim 1 wherein the matrix electrical interconnection provides a global signal upon depression of any of the keys which is detected by the controller so that the controller knows that a key has been pressed and the controller then initiates a scanning regime to determine which of the keys has been pressed.

7. The keypad of claim 6 wherein each key has a first switch and a second switch, and the global signal is provided by a the second switch associated with each key which is closed upon depression of the key to cause the global signal to be provided to the controller.

8. The keypad of claim 6 wherein the global signal is provided by a change in state of at least one of the scan lines.

9. The keypad of claim 1 wherein switching means is provided for maintaining the matrix electrical interconnection at a predetermined state and for switching the matrix electrical interconnection so that the interconnection is able to take up a state dependant on the signals supplied by the control means and the pressing of a key so that scanning signals can then be supplied to interrogate the matrix.

10. The keypad of claim 9 wherein the switching means comprises at least one field effect transistor which is switched to a predetermined state to cause the matrix to maintain a predetermined state and which, when switched to another state enables the matrix to take up a state dependant on the signals supplied by the control means and the pressing of a key.

11. The keypad of claim 1 wherein the state actuating means comprises the control means and at least one switch element, the control means being for controlling the switch element to cause the matrix interconnection to take up a predetermined logic state before release of the pressed key so release of the key does not cause a change in state of the matrix interconnection.

12. The keypad of claim 11 wherein each of the keys are connected to a common circuit which is connected to the control means, so that when a key is released, the release is detected by the control means via the common circuit to indicate release of the key without identifying which key has been released because of the connection of all keys to the common circuit.

13. The keypad of claim 12 wherein the switch element comprises a plurality of transistors which are connected between the keys and ground so that when the transistors are switched on by the control means, the transistors pull the matrix interconnection to a low logic state so that when the key is released, the common circuit is also pulled to a low logic state and the matrix interconnection is maintained at the low logic state, and whereupon low logic state on the common circuit is detected by the control means to switch the transistors off and to set the common circuit to a logic high to await pressing of a further key and then for the control means to interrogate the matrix electrical interconnection to determine that key which has been pressed.

14. The keypad of claim 12 wherein the keys are all connected on a common line of the keypad which acts as the common circuit and wherein the switch means comprises a plurality of transistors connected between the keys and ground so that when the transistors are switched on, the matrix interconnection is pulled to a low logic state so that when the key is released, the matrix interconnection does not change state and release of the pressed key is detected by the common circuit.

15. The keypad according to claim 12 wherein the switch means comprises a plurality of transistors connected between the keys and ground, and the keys are spread over a plurality of separate lines of the matrix interconnection, the separate lines being coupled together by an electrical tie, the electrical tie being coupled to the control means so that when the electrical tie is controlled by the control means to couple all of the lines together, the coupled lines form the common circuit, and wherein when a key is pressed the transistors are controlled to conduct so as to pull the matrix interconnection to a low logic state so that when the key is released, there is no change in state of the matrix interconnection, and wherein release of the key is detected by the control means via the common circuit formed by the connected lines which are connected by the electrical tie without the identity of the pressed key being determined because of the interconnection of the lines.

16. The keypad of claim 1 wherein the state actuating means ceases interrogation of the matrix interconnection upon detection of a genuine key by pulling the matrix interconnection to a predetermined logic state and resumes interrogation when the key is released, and whereupon a common circuit coupled to the controller and to the keys is provided for enabling the control means to detect release of the depressed key.

* * * * *

UNITED STATES PATENT AND TRADEMARK OFFICE
CERTIFICATE OF CORRECTION

PATENT NO. : 7,133,029 B2
APPLICATION NO. : 10/470985
DATED : November 7, 2006
INVENTOR(S) : Jamieson et al.

It is certified that error appears in the above-identified patent and that said Letters Patent is hereby corrected as shown below:

At column 1, line 41, "Read line" should be replaced by --read line--.
At column 1, line 41, "the n" should be replaced by --the--.
At column 2, line 12, "computer/CUP" should be replaced by --computer/CPU--.
At column 2, line 35, "(IE the" should be replaced by --(i.e., the--.
At column 3, line 36, "has" should be replaced by --have--.
At column 3, line 45, "on" should be replaced by --one--.
At column 3, line 53, "do" should be deleted.
At column 3, line 56, "as" should be replaced by --a--.
At column 5, line 19, "(i.e." should be replaced by --(i.e.,--.
At column 7, line 51, "8 is circuit" should be replaced by --8 is a circuit--.
At column 8, line 47, "show" should be replaced by --shows--.
At column 8, line 65, "The inventor 114" should be replaced by --The inverter 114--.
At column 9, line 3, "connect d" should be replaced by --connected--.
At column 9, line 23, "be" should be replaced by --been--.
At column 9, line 27, "of the one" should be replaced by --of one--.
At column 9, line 35, "lines 120" should be replaced by --lines 100--.
At column 9, line 57, "determining" should be replaced by --determine--.
At column 10, line 27, "labelled" should be replaced by --labeled--.
At column 10, line 30, "labelled" should be replaced by --labeled--.
At column 10, line 31, "labelled" should be replaced by --labeled--.
At column 10, line 56, "shows" should be replaced by --show--.
At column 13, line 50, "the CUP" should be replaced by --the CPU--
At column 13, line 52, "the rad line" should be replaced by --the read line--.
At column 13, lines 54-55, "lines re kept" should be replaced by --lines are kept--.
At column 14, line 29, "an" should be replaced by --and--.
At column 15, line 33, "press this is" should be replaced by --press. This is--.
At column 17, line 4, "bee" should be replaced by --been--.
At column 18, line 12, "scan lines goes" should be replaced by --scan lines go--.
At column 18, line 21, "ports" should be replaced by --port--.

UNITED STATES PATENT AND TRADEMARK OFFICE
CERTIFICATE OF CORRECTION

PATENT NO. : 7,133,029 B2
APPLICATION NO. : 10/470985
DATED : November 7, 2006
INVENTOR(S) : Jamieson et al.

It is certified that error appears in the above-identified patent and that said Letters Patent is hereby corrected as shown below:

At column 18, line 41, "associate" should be replaced by --associated--.
At column 18, line 45, (ie the" should be replaced by --(i.e., the--.

Signed and Sealed this

Twentieth Day of May, 2008

JON W. DUDAS
*Director of the United States Patent and Trademark Office*